United States Patent
Rhyner et al.

(10) Patent No.: US 8,053,349 B2
(45) Date of Patent: Nov. 8, 2011

(54) BGA PACKAGE WITH TRACES FOR PLATING PADS UNDER THE CHIP

(75) Inventors: Kenneth R. Rhyner, Rockwall, TX (US); Kevin Lyne, Fairview, TX (US); David G. Wontor, Dublin, CA (US); Peter R. Harper, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 37 days.

(21) Appl. No.: 12/124,305

(22) Filed: May 21, 2008

(65) Prior Publication Data

US 2009/0115072 A1    May 7, 2009

Related U.S. Application Data

(60) Provisional application No. 60/984,584, filed on Nov. 1, 2007.

(51) Int. Cl.
*H01L 21/44* (2006.01)

(52) U.S. Cl. . 438/598; 438/108; 438/612; 257/E21.001; 257/778

(58) Field of Classification Search .................. 438/108, 438/598
See application file for complete search history.

(56) References Cited

U.S. PATENT DOCUMENTS

| | | | |
|---|---|---|---|
| 3,967,162 A | 6/1976 | Ceresa et al. | |
| 4,437,141 A | 3/1984 | Prokop | |
| 4,495,377 A | 1/1985 | Johnson et al. | |
| 4,643,526 A | 2/1987 | Watanabe et al. | |
| 5,189,505 A * | 2/1993 | Bartelink | 257/419 |
| 5,216,278 A | 6/1993 | Lin et al. | |
| 5,324,985 A | 6/1994 | Hamada et al. | |
| 5,424,492 A | 6/1995 | Petty et al. | |
| 5,491,364 A | 2/1996 | Brandenburg et al. | |
| 5,610,833 A | 3/1997 | Chang et al. | |
| 5,627,405 A | 5/1997 | Chillara | |
| 5,729,894 A | 3/1998 | Rostoker et al. | |
| 5,885,855 A | 3/1999 | Liang | |
| 5,981,873 A | 11/1999 | Heo | |

(Continued)

FOREIGN PATENT DOCUMENTS

JP    06104375 A1    4/1994

(Continued)

OTHER PUBLICATIONS

Dally, James W. Packaging of Electronic Systems. 1990. McGraw Hill, pp. 129-131.*

*Primary Examiner* — Ajay K Arora
(74) *Attorney, Agent, or Firm* — Yingsheng Tung; Wade J. Brady, III; Frederick J. Telecky, Jr.

(57) ABSTRACT

A semiconductor flip-chip ball grid array package (600) with one-metal-layered substrate. The sites (611) of a two-dimensional array become usable for attaching solder balls of the signal (non-common net assignment) I/O type to the substrate under the chip area (601), when the sites can be routed for metal plating (620). The space to place a maximum number (614) of signal routing traces is opened up by interrupting the periodicity of the site array from the edge (602) of the substrate towards the center under the chip. The periodicity is preferably interrupted by depopulating entire aligned lines and rows of the two-dimensional array.

13 Claims, 6 Drawing Sheets

U.S. PATENT DOCUMENTS

| | | | |
|---|---|---|---|
| 6,071,801 A | 6/2000 | Wachtler et al. | |
| 6,133,134 A | 10/2000 | Mehr | |
| 6,150,729 A | 11/2000 | Ghahghahi | |
| 6,194,668 B1 | 2/2001 | Horiuchi et al. | |
| 6,194,782 B1 | 2/2001 | Katchmar | |
| 6,229,099 B1 | 5/2001 | Horiushi et al. | |
| 6,243,283 B1 | 6/2001 | Bertin et al. | |
| 6,271,478 B1 | 8/2001 | Horiuchi et al. | |
| 6,285,560 B1 | 9/2001 | Lyne | |
| 6,310,398 B1 | 10/2001 | Katz | |
| 6,313,522 B1 | 11/2001 | Akram et al. | |
| 6,327,695 B1 | 12/2001 | Bothra et al. | |
| 6,407,344 B1 | 6/2002 | Horiuchi et al. | |
| 6,448,634 B1 | 9/2002 | Hashimoto | |
| 6,479,758 B1 | 11/2002 | Arima et al. | |
| 6,664,483 B2 | 12/2003 | Chong et al. | |
| 6,689,634 B1 | 2/2004 | Lyne | |
| 6,779,783 B2 * | 8/2004 | Kung et al. | 257/780 |
| 6,903,458 B1 * | 6/2005 | Nathan | 257/737 |
| 7,420,284 B2 * | 9/2008 | Miyazaki et al. | 257/781 |
| 2007/0194415 A1 * | 8/2007 | Seng et al. | 257/678 |

FOREIGN PATENT DOCUMENTS

| | | |
|---|---|---|
| JP | 2000040771 A | 2/2000 |
| JP | 2001135898 A | 5/2001 |
| KR | 20070082410 A | 8/2007 |

* cited by examiner

BGA PACKAGE WITH TRACES FOR PLATING PADS UNDER THE CHIP

FIELD OF THE INVENTION

The present invention is related in general to the field of semiconductor devices and processes, and more specifically to the structure and processes of substrates of ball grid array packages combining small size with high contact numbers.

DESCRIPTION OF RELATED ART

In the popular ball-grid-array (BGA) packages of electronic devices, the semiconductor chip is assembled on the inside surface of an insulating substrate, which has metal layers for interconnecting traces. The connection to external parts is provided by solder balls attached to solder pads on the outside surface of the substrate.

Traditionally, the chips are mounted on the substrate by bonding wires, which connect the chip contacts to the traces. An example of such wire bond assembly can be found in hand-held wireless telephones. Recently however, BGA packages have experienced a transition to flip-chip mounting of the chips onto the substrates. The semiconductor chips, which are intended for the flip-operation, have their contact pads prepared with metal bumps, such as gold studs or solder balls, to enable the connection to bump pads on the substrate.

FIG. 1 shows a simplified cross section of a partial BGA package with a single metal layer to illustrate the typical flip-chip assembly of a semiconductor chip 101 on an insulating substrate 102. The chip has contacts with metal bumps 103, made of gold or copper; the bumps connect the chip contacts to the contact pads 103a on the substrate. The pads narrow into traces 104 and connect to through-holes 105, which are partially filled with metal 105a; the remaining space of the through-holes is filled with solder of the solder balls 106 providing the connection to external parts. The filler metal 105a of each via is capped by land 110. For stress relief, the gap between chip 101 and substrate 102 may be filled with a polymerized polymer precursor 107. Chip 101 and metal traces 104 are frequently protected by an encapsulating compound 108, which also provides mechanical strength to the BGA, especially when insulating substrate 102 is made of a thin tape.

A small number of solder balls 106 of a typical BGA device serve the power and ground connections of the chip; this minority of solder balls has common net assignment and can thus be satisfied with relatively few traces 104. The majority of solder balls 106 of a typical BGA device are dedicated to the signal input/output (I/O) terminals of the chip; these solder balls have non-common net assignments and thus need a large number of individual traces 104.

The metal layer 102 is usually made of a thin copper foil, which is patterned to create the traces 104 and areas for bump pads 103 and lands 110, the portions selected to become bump pads have to be prepared to accept the chip bumps. The bump pads are often plated with nickel to a thickness convenient for the bump attachment, followed by the deposition of a thin surface film such as gold, metallurgically suitable for bump attachment. In addition, the metal 105a in the vias has to be deposited. For both purposes, the most economical deposition technique is electroplating. This method requires routing traces, which connect the bump pads and the vias to the plating bars for supplying the plating current.

The sites for attaching the solder balls form in a typical BGA package a regularly pitched array of horizontal lines and vertical rows. A top view of a conventional BGA device without the encapsulation compound, generally designated 200, is illustrated in FIG. 2. In FIG. 2, chip 201 is flipped onto substrate 202 in the central region of substrate 202, with the back side of chip 102 facing up. The conducting traces 204 of the substrate 202, which lead under the chip to connect to a respective bump, are spaced regularly along the chip periphery 201a. Traces 204 serve first as plating traces in the electroplating process of the bump pads, and later as signal, power and ground lines for the circuitry on chip 201.

Because the size of the solder balls and the size of the lands are relatively large, the lands 210 and the vias are arrayed along the peripheral regions of substrate 202. In FIG. 2, the land array exhibits three lines and three rows. Each land 210 is connected by a trace 204 to the respective bump of chip 201, and further by a trace 203 outwardly toward electroplating bar 220 connected to an electrical supply 220a). In the example of FIG. 2, the BGA device has a substrate with 216 lands (extending into conductive vias and solder balls, see FIG. 1), and 216 traces, satisfying the need of chip 201.

The majority of lands 210 and traces 204 serve the signal I/O's of chip 201; these lands and traces have non-common net assignments. A small number of lands 210 and traces 204 serve the power and ground terminals of chip 201 and have thus common net assignment. A few of the power/ground lands of common net assignment may be placed under chip 201.

Ongoing market trends strongly push for increased numbers of chip signal I/O's in semiconductor devices; there exists, therefore, a demand for increased numbers of balls of the BGA package to satisfy the increasing demand for non-common net assignments. At the same time, other ongoing market trends call for shrinking package sizes and for reduced package cost.

In contemporary ball grid array packages, the effort to shrink package sizes has led to reduced land pitches center-to-center. As a consequence the number of routing traces that may be placed between adjacent pads is very limited. This limit makes it difficult to add additional lands to the array and to place the routing traces from these additional lands to the plating bar.

One solution to this problem is to add more metal layers to the substrate. These layers, however, have to be patterned into traces, and the traces of the various layers have to be interconnected with metal-filled through-holes—vias. One additional layer of metal may increase the cost of a substrate by as much as 30%.

SUMMARY OF THE INVENTION

Applicants invented an alternative solution to problem of accommodating increasing number of I/Os on a BGA substrate without having to add costly metal layers. Some embodiments of the invention call for strategically interrupting the periodicity of the land-array at the edge of the substrate to place additional plating traces leading towards the interior of the substrate, connecting additional lands placed under the chip. The periodicity may be interrupted by depopulating aligned lines and rows of the two-dimensional array. The additional lands under the chip thus become usable for attaching solder balls of the signal (non-common net assignment) I/O type.

With lines and rows of the array depopulated and the array sites in the substrate center connectable to the plating bar, the substrate is patterned into lands located over the signal vias in the substrate center, and signal traces connecting each land to the substrate edge.

Portions of the traces, as well as the vias under the connected lands at the interior portion of the substrate under the chip, are exposed during the plating process, which disposes concurrently coats of bondable and solderable metals in the through-holes, and on the exposed portions of the traces. The plated trace portions can then be used as bump sites for flipping a bumped chip onto the substrate, and the plated through-holes can be used for creating conductive vias and attaching solder balls to the substrate.

It is a technical advantage of the invention that sites under the assembled chip, which in conventional technology may not be used for non-common net assignments due to lack of routing traces to the substrate edge for the plating process and electrical connection without added layers of metal, are now accessible for plating and can thus be used as conductive signal vias. As an example, in a 12×12 mm BGA package with a substrate of a single metal layer, conventional technology provides only 216 routable sites and thus only 216 connections by signal solder balls. According to some embodiments of the invention, 81 additional signal routing traces to sites under the chip may be placed by interrupting the periodicity of the site array from the substrate edge to the substrate center. Thick metal layers can be deposited in the through-holes to create conductive vias, and in the trace windows to create bump pads. Furthermore, after the bumped semiconductor chip is flip-assembled on the pads, the additional traces can provide the signal connection from the chip to the solder balls attached to the conductive vias, increasing the number of signal terminals of the package.

As an additional technical advantage of the invention, the methodology is scalable. For example, the pitch of the additional traces can be reduced from 25 μm to 15 μm or 10 μm and even smaller. This means that the cost advantage can be retained for future fabrication nodes and product generations.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
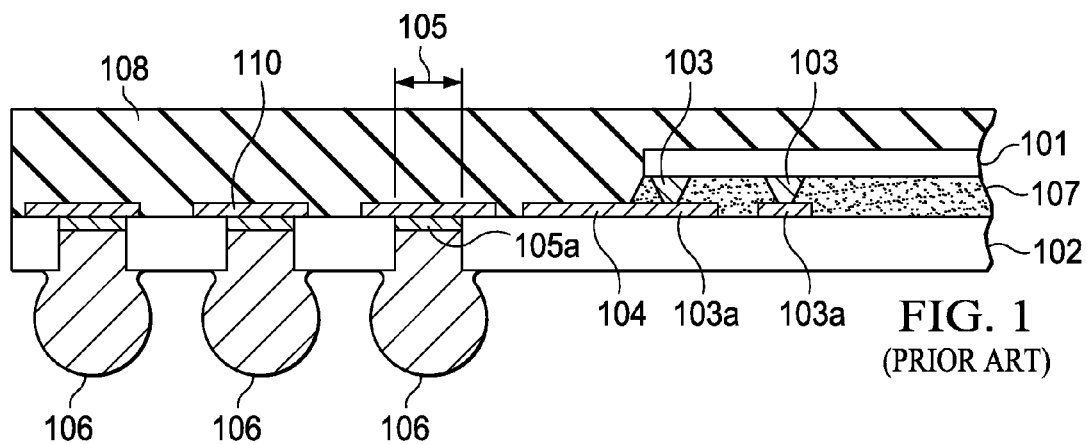
FIG. 1 shows a schematic cross section of a portion of a conventional ball grid array device with a flip-chip mounted on a one-metal layer substrate having solder balls under the peripheral substrate regions.
Figure 2:
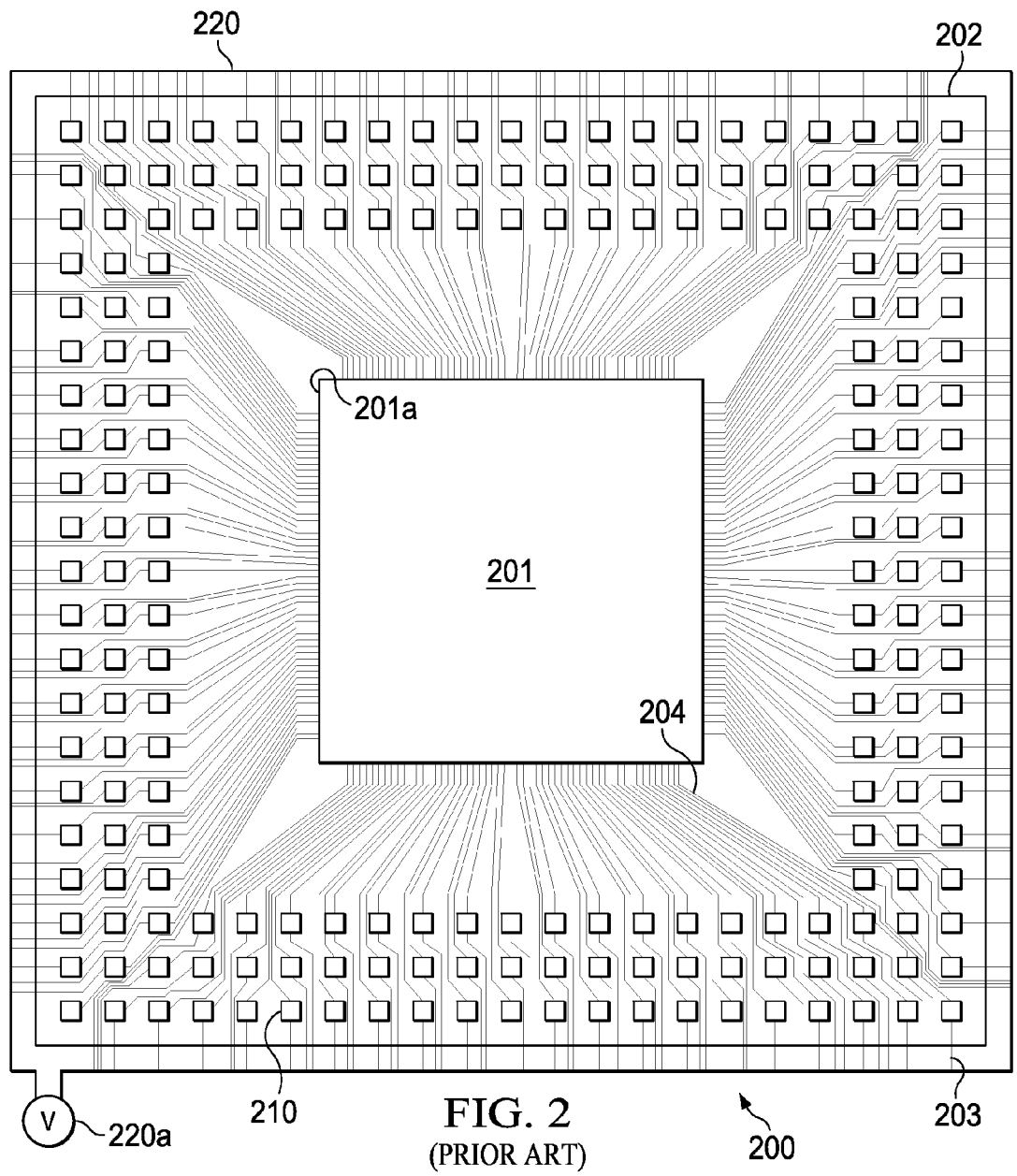
FIG. 2 illustrates a schematic top view of a conventional ball grid array device with the chip flipped onto a substrate having solder balls under the peripheral
Figure 3:
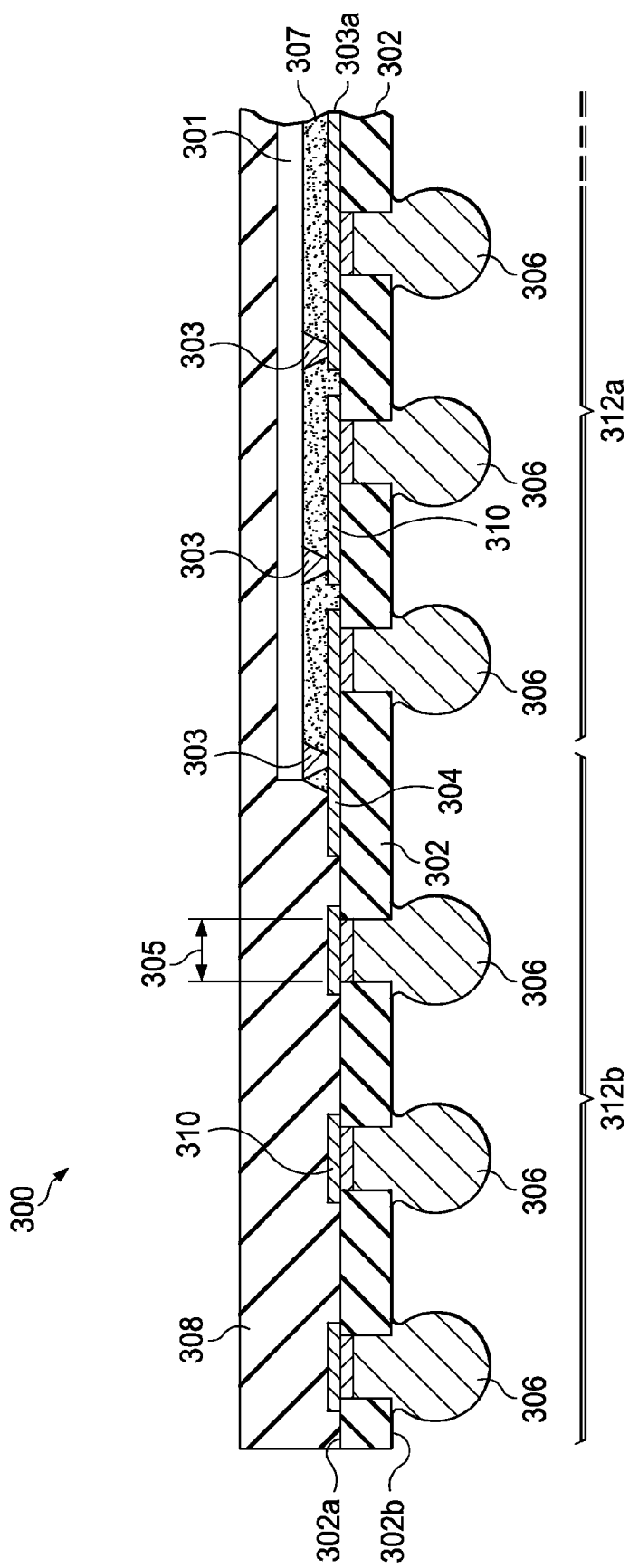
FIG. 3 shows a schematic cross section of a portion of a ball grid array device according to an embodiment of the invention, the chip flipped onto a one-metal layer substrate having solder balls under the peripheral and the central substrate regions.

FIG. 3 illustrates an embodiment of the invention. The figure shows a portion 300 of a ball grid array (BGA) device, which includes a semiconductor chip 301 assembled on a substrate 302. The figure emphasizes the connections for signals (non-common net assignments). The chip inputs/outputs (I/O's) have contacts with metal bumps 303, preferably gold or copper; the bumps connect the chip contacts to the contact pads 303a on the substrate.

Substrate 302 is made of a sheet-like insulating material, preferably a tape of a polyimide compound or alternatively of a thicker and stiffer polymer. Sheet-like substrate 302 has a first surface 302a and a second surface 302b. The substrate includes a central region 312a, onto which the chip is attached, surrounded by peripheral regions 312b, which border on the substrate edges. Substrate 302 has a metal foil on the first surface 302a; the metal foil is patterned. Portions of the patterned foil include contact pads 303a.

Substrate 302 further has through-holes 305 extending from the first surface 302a to the second surface 302b. Through-holes 305 are filled with metal so that they are electrically conductive vias. Solder balls 306, attached to the metal-filled vias, provide connection to external parts. On the first substrate surface 302a, the filler metal of each via is capped with a land 310, which is patterned from the metal foil on first surface 302a. FIG. 3 shows a portion of a metal trace 304, which extends from the signal land 303a. For stress relief, the gap between chip 301 and substrate 302 may be filled with a polymerized polymer precursor 307. Chip 301 and metal traces 304 may be protected by an encapsulating compound 308, which also provides mechanical strength to the BGA, especially when insulating substrate 302 is made of a thin tape. Preferably, encapsulation 308 is a molding compound.

Figure 4:
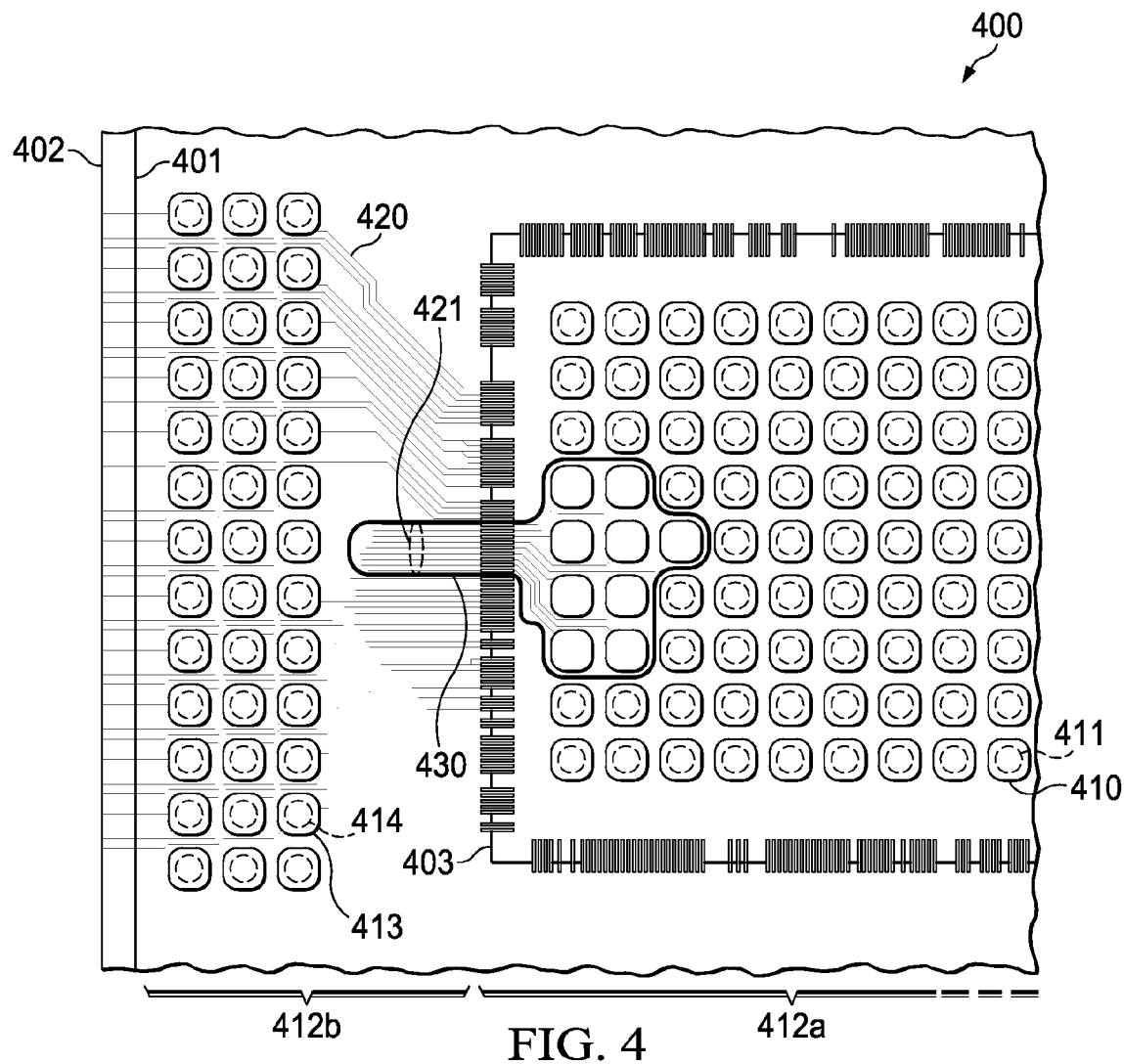
FIG. 4 is a schematic top view of a substrate portion for a ball grid array package, illustrating the problem of connecting a higher number of site traces under the chip area to the plating bar than conventional routing can accommodate.
Figure 5:
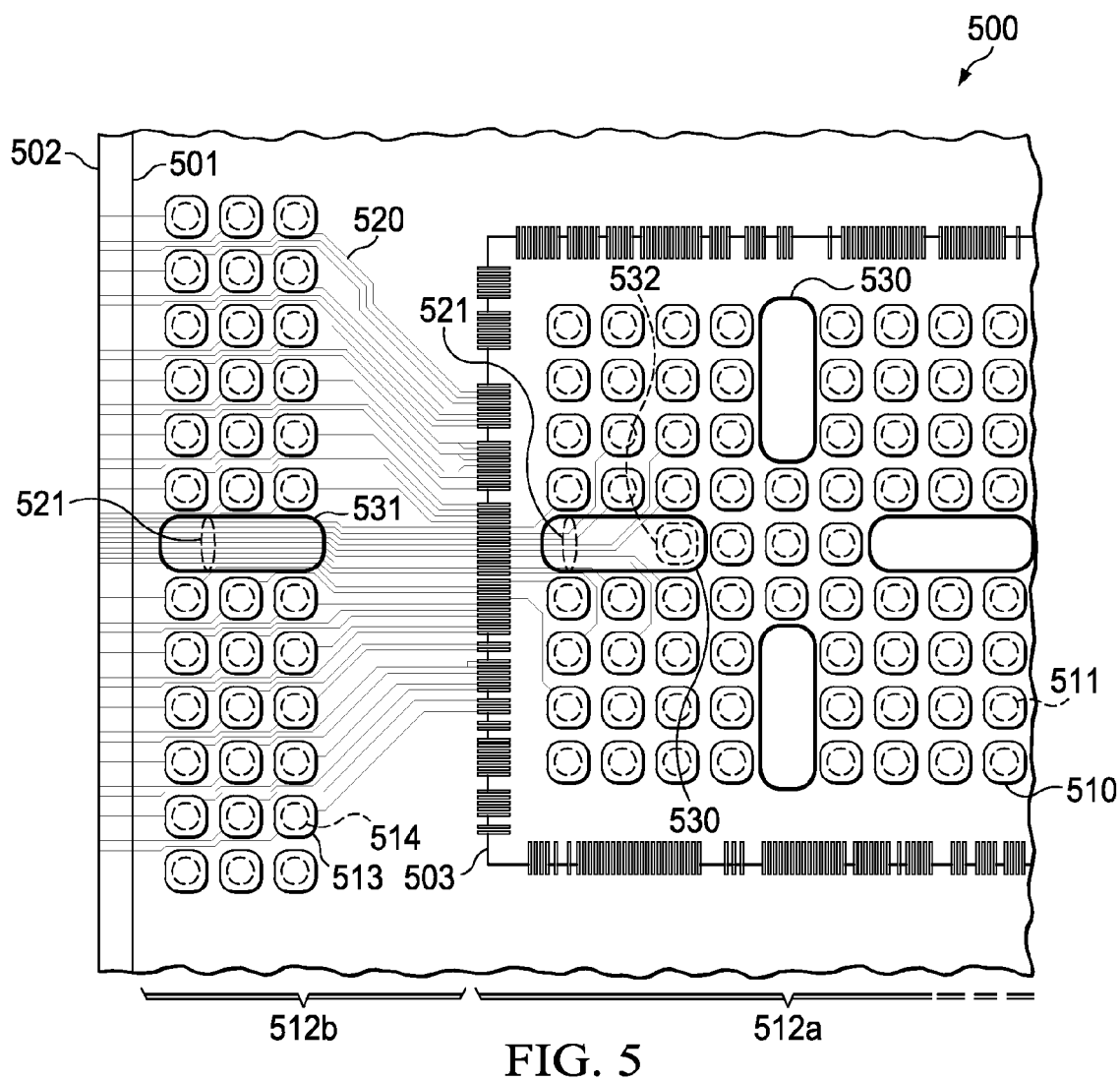
FIG. 5 is a schematic top view of a substrate portion for a ball grid array package, illustrating an embodiment of the invention—Interrupting the periodicity of the site array from the edge of the substrate towards the center under the chip and connecting all site traces under the chip area to the plating bar.

In order to explain more clearly the embodiment of the invention as shown in FIG. 5, it is helpful to first discuss a preliminary step and its still insufficient result as illustrated in FIG. 4. The preliminary step involves an attempt to use the substrate area under the assembled chip in order to place lands, conductive vias and solder balls to serve as additional signal (non-common net assignment) I/O's. It should be pointed out that the following solution description focuses on signal vias and signal traces due to their rapidly increasing numbers; the handling of the power and ground vias and traces with their common net assignment represents is of only secondary importance.

The top view of FIG. 4 illustrates a portion of a substrate, generally designated 400, which includes the substrate edge 401, the plating bar 402 and lands/vias arranged so that they attempt to satisfy the I/O needs of the chip.

FIG. 4 further includes exemplary metallic traces 420 connecting the lands 410 and 413 to the plating bar 402. Design rules allow for each trace 420 a certain width, in the example of FIG. 4 preferably between about 10 and 20 μm wide, and a certain pitch, in the example of FIG. 4 preferably between 15 and 25 μm. Restrictions imposed by substrate shrinkage allow only two traces between adjacent lands 413 to reach the plating bar 402. As a consequence of these restrictions, there is not enough space for the traces of all the central array lands 410 to connect to the plating bar 302. In the example of FIG. 4, a group of lands 410 without possibility of connection to the plating bar 402, together with their blocked traces 421, is surrounded by a heavy line 430.

One embodiment of the invention, which offers the solution as how to place the blocked traces, as shown in FIG. 5. The top view of FIG. 5 illustrates a portion of a substrate, generally designated 500, similar to the portion shown in FIG. 4; the portion includes the substrate edge 501, the plating bar 502, and the projection 503 of a chip edge. The range of the substrate region under the chip, the central region, is designated 512a, and the range of the peripheral substrate regions is designated 512b. The metallic lands 510 in the central region populate selected sites of a regularly pitched two-dimensional site array of horizontal lines and vertical rows. The conductive vias under lands 510 are designated 511 and shown as dashed circles; vias 511 are signal vias in the area under the chip. The selected sites in the central region represent a first set of signal lands/vias.

As FIG. 5 shows, there are certain unselected array sites in region 512a, preferably arranged in lines and rows, which are free of lands/vias and thus referred to as free-zones. In FIG. 5, the free-zones are designated 530. The free-zones are generally oriented from the center of region 512a outwardly.

FIG. 5 further shows signal lands 513 spreading throughout the portion 512b of the peripheral substrate regions. The dashed circle 514 inside each land 513 indicates the conductive via under each land 513. The other peripheral substrate regions surrounding the central substrate region are not shown in FIG. 5 but are included in FIG. 8. The metallic lands 513 in the peripheral regions populate selected sites of a regularly pitched two-dimensional site array of vertical rows and horizontal lines (a portion of the rows are shown in FIG. 5; the lines are included in FIG. 8). The selected sites in the peripheral regions represent a second set of signal lands/vias.

There are certain unselected array sites in the peripheral regions, preferably arranged in lines and rows, which are free of lands/vias and thus referred to as free-zones. One of the free-zones, designated 531, is shown in FIG. 5. The free-zones are generally oriented from the periphery inwardly; preferably, a free-zone 531 is substantially aligned with a free-zone 530 to enable an approximately linear placement of traces.

FIG. 5 further includes exemplary metallic traces 520 connecting the lands 510 and 513 to the plating bar 502. In particular, FIG. 5 shows the plurality 521 of signal traces disposed in the free-zone 531 and the aligned free-zone 530. In order to maximize the number of traces channeled through the free-zone, the traces are preferably placed in parallel at the minimum pitch allowed by the design rules. These design rules allow for each trace 520 a certain width, in the example of FIG. 5 preferably between about 10 and 20 μm wide, and a certain pitch, in the example of FIG. 5 preferably between 15 and 25 μm.

Since the signal traces in the plurality 521 are channeled essentially in parallel to each other (at the exemplary pitch between 15 and 25 μm), a significant number of traces can be placed in the free-zones 531 and 503 (in the example of FIG. 5, nine traces). Consequently, the traces of plurality 521 are numerous enough to provide the connection of a corresponding number of lands 510 surrounding free-zone 530 to the plating bar 502.

While a relatively small number of array sites have to be left unpopulated of lands/vias in order to create the free-zones, the sacrifice is outweighed by the benefit of placing a larger number of additional traces in the free-zones and thus providing the connection to the plating bar in order to plate the metals in the vias and on the traces for creating additional signal lands/vias under the assembled chip. As an example, in FIG. 5 six array sites have to remain unpopulated in order to channel nine traces at the given trace width and trace pitch. Obviously, more traces could be placed if the required pitch were relaxed. Alternatively, sometimes size and shape of the free-zone could be specialized; as an example, the site designated 532 could stay populated so that only five sites needed to become unpopulated.

Figure 6:
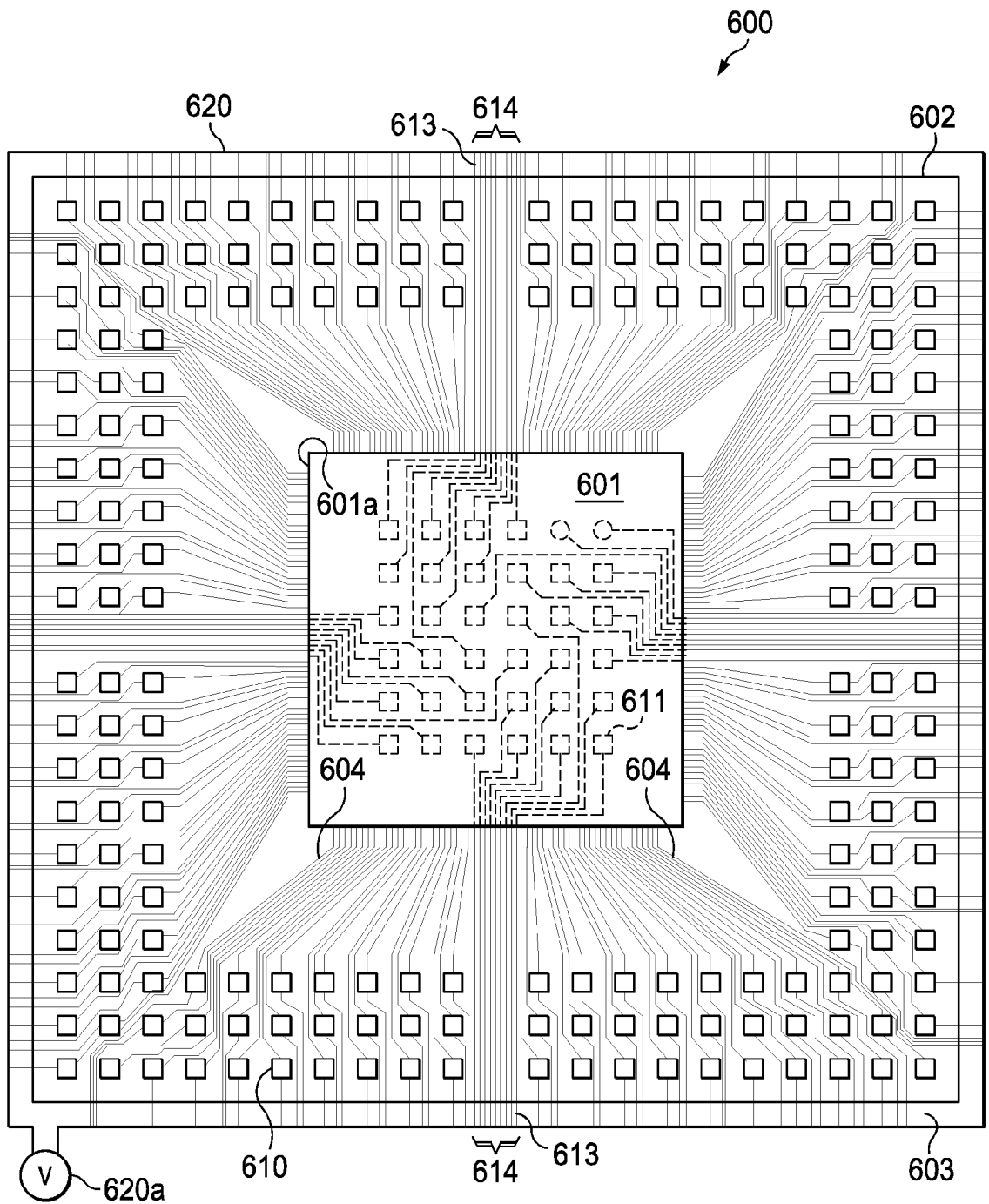
FIG. 6 illustrates a schematic, semi-transparent top view of a ball grid array device with the chip flipped onto a substrate having solder balls under the peripheral and the central substrate regions.

In many BGA package substrates, the selection of unpopulated array sites is symmetrical relative to the assembled chip, as shown in the example of FIG. 6. Using the unpopulated lines and rows for channeling additional routing traces to the plating bar, the 12×12 mm BGA package quoted above can increase the number of signal vias/solderballs to 290, or even 300, from 220. By using narrower traces, a higher number of traces can be channeled in the free-zones, and thus even higher numbers of signal vias/solderballs can be achieved.

A BGA package according to an embodiment of the invention is shown in the top view of FIG. 6 without encapsulation compound. The BGA package, generally designated 600, has a regularly pitched two-dimensional site array of horizontal lines and vertical rows. Chip 601, drawn to be transparent to show substrate underneath, is flipped onto substrate 602 in the central region of the substrate. Some conducting traces 604 of the substrate 602, which lead under the chip to connect to a respective bump, are spaced regularly along the chip periphery 601a; traces 604 serve as signal, power and ground lines for the circuitry on chip 601.

Some lands 610 of the conductive vias through the substrate are arrayed along the peripheral regions of substrate 602. In FIG. 6, the land array populates selected sites in lines and rows. Each land 610 is connected by a trace 604 to the respective bump of chip 601, and further by a trace 603 outwardly toward electroplating bar 620 for electroplating purposes, as indicated by electrical potential V at supply 220a. The majority of lands 610 and traces 604 serve the signal I/O's of chip 601; these lands and traces have non-common net assignments. A small number of lands 610 and traces 604 serve the power and ground terminals of chip 601 and have thus common net assignment.

FIG. 6 further shows a number of traces 613 disposed as pluralities 614 in free-zones, wherein the free-zones include the sites unselected for lands. Traces 613 connect to the plating bar 620 and further to lands 611 under the assembled chip in the central substrate region; lands 611 serve signal I/O's of chip 601. Lands 611 are arranged in a two-dimensional array of lines and rows and are disposed over conductive vias to solder bodies.

Figure 7:
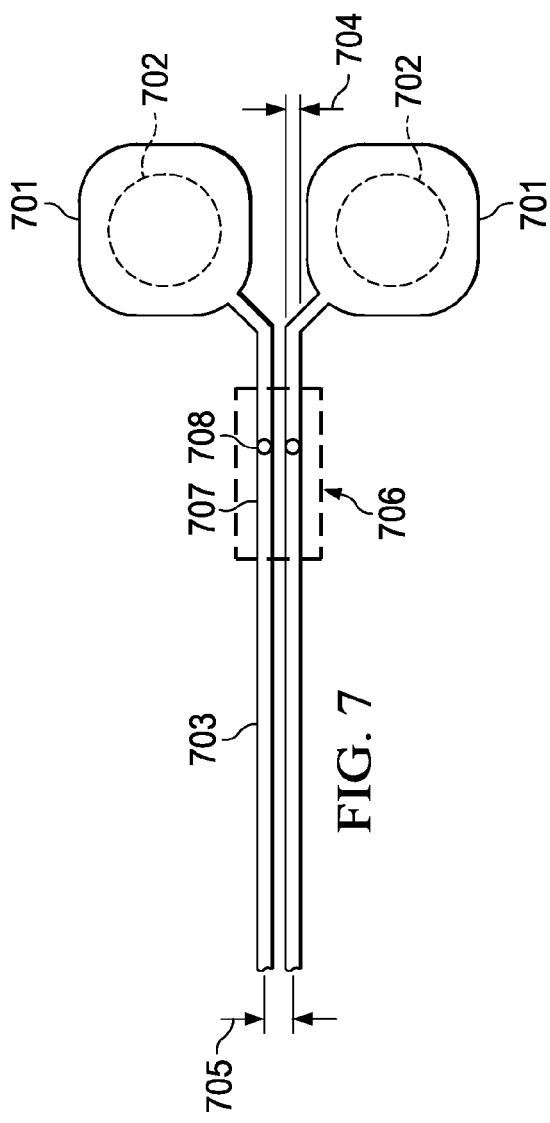
FIG. 7 is a schematic top view of two via lands with connecting traces.

As stated earlier, the benefit of connecting traces to the plating bar is the ability to deposit metal coats in the through-holes and on the trace portions intended to become bump pads. FIG. 7 depicts, in top view, a pair of metallic lands 701 over through-holes 702, depicted as dashed circles. A trace 703 connects each land to the plating bar. The trace width 704 may be between about 10 and 20 μm, and the pitch 705 center-to-center between adjacent traces between about 15 and 25 μm; the industry trend is for both ranges to decrease. The surface of the substrate, including the traces and the lands, is covered by an insulating layer (so-called soldermask, assumed to be transparent in FIG. 7). During the plating operation, a metal coat is deposited onto the land exposed within the through-hole, at least partially filling the though-hole with metal to become a conductive via.

Element 706 indicates a window (about 300 μm long) opened in the soldermask for the plating operation. The trace portion 707 exposed by the window permits deposition of a metal coat during the plating operation so that the exposed trace portion becomes suitable for attaching a contact bump (about 10 to 20 μm diameter) affixed to the chip-to-be-assembled onto some location 708 of the exposed trace portion.

Figure 8:
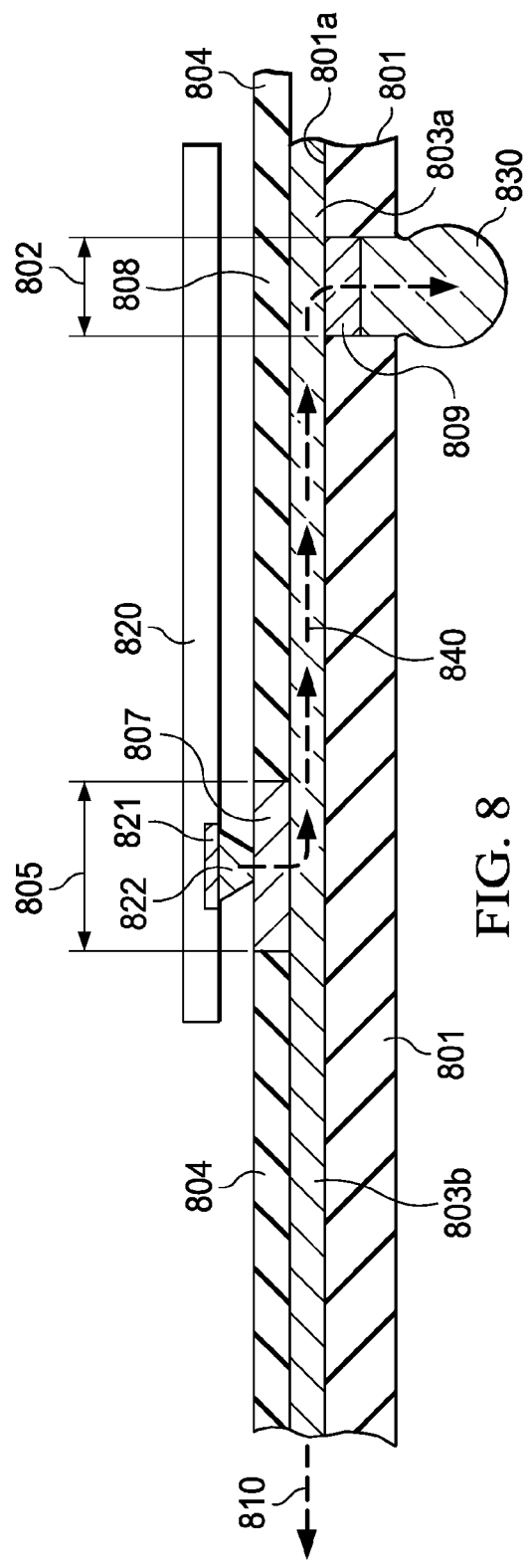
FIG. 8 illustrates a schematic cross section of a via and connecting trace shown in FIG. 7, with a chip portion flip-connected to the substrate.

FIG. 8 depicts, in cross sectional view, the pad and trace configuration of FIG. 7. Sheet-like substrate 801, made of insulating material such as polyimide in the thickness range from about 50 to 300 μm, has on its surface 801*a* the metal foil, preferably copper in the thickness range from about 6 to 18 μm, patterned into land 803*a*, located over through-hole 802, and trace 803*b*. Trace 803*b* connects land 803*a* to the plating bar 810. An insulating soldermask 804 is shielding trace 803*b* except for a window 805.

The plating process, preferably electroplating, adds metal into windows 802 and 805, preferably up to the thickness of the soldermask. In the preferred embodiment, a nickel coat of about 1 μm thickness is deposited on the copper, and then a gold coat of about 2 to 3 μm thick is deposited on the nickel. FIG. 8 depicts coat 807 in window 805. The plating process further adds a metal coat 809 on the copper foil exposed in the through-hole 802. In the reflow process solder, preferably including tin, wets readily on the gold surface of coat 809 and thus fills the remainder of through-hole 809, thereby transforming it into a conductive via. Solder body 830 provides the connection to external parts.

FIG. 8 shows semiconductor chip 820 with contact 821 and metal bump 822. For the assembly on the substrate, bump 822 is preferably made of gold or copper, which attach readily to the gold surface of coat 807. An electrical path is thus established for signals between chip contact 821, solder body 830 and external parts. In FIG. 8, the electrical path is indicated by arrows 840.

Another embodiment of the invention is a method for fabricating an electronic device, especially a device of the ball grid array type and including a semiconductor chip on a substrate. The semiconductor chip has contacts and metal bumps on the contacts. The preferred choice as bump metal is gold or copper. The insulating substrate may be, for example, a polyimide tape about 50 to 300 μm thick. The substrate has a first and a second surface, a periphery, and a central region surrounded by peripheral regions.

In the next process step, through-holes are opened in the substrate by techniques such as laser drilling, mechanical drilling, or etching, extending the through holes from the first to the second surface. A group of through-holes populate a group of selected sites that from regularly pitched two-dimensional array of lines and rows. A first plurality of the selected sites spreads throughout the central substrate region, and a second plurality of selected sites spreads throughout the peripheral substrate regions.

There are unselected sites of the array, preferably arranged in lines and rows from the periphery to the central region, defining a number of free-zones on the first surface of the substrate. While it is preferred for many BGA devices that the unselected sites in the peripheral substrate region be aligned in terms of aligned lines and rows with unselected sites in the central substrate region, this condition is not required.

In the next step, a metal foil is deposited on the first surface by a lamination process, for instance. The foil may be made of copper or a copper alloy in the thickness range from about 6 to 18 μm and covers the through-holes. The metal foil is patterned by laying a photoresist pattern on the foil, protecting portion of the foil while the exposed metal portions are removed by etching; thereafter, the photoresist is removed. The pattern thus created is an interconnected network of metal lands and traces. Preferably, the traces have a width between about 10 and 20 μm, and, where the traces run in parallel, they maintain a pitch from center-to-center between of about 15 and 25 μm. The width of the traces and the pitch are for example only. Following the trend of the industry, they will no doubt become smaller in the future.

The metal network is designed so that the lands are located over the through-holes and are connected by the traces to the substrate periphery for connection to the plating bar. The traces are patterned, in particular, so that a plurality of them is channeled in the free-zones. Preferably, the traces are running substantially in parallel in the free-zones if it is desirable to channel a maximum number of traces in the free-zones.

Next, an insulating mask, customarily called a solder mask, is disposed over the substrate. Windows are then opened in the mask in the central substrate region and are positioned to expose portions of the traces, which match the chip contact locations. Using a metal deposition process, preferably the electroplating technique, coats of bondable and solderable metals are deposited on the trace portions exposed in the solder mask windows, coats of bondable and solderable metals are also deposited on the metal foil exposed inside the through-holes. By this deposition step, the exposed trace portions are prepared to become bump pads, and the through-holes are transformed to become conductive vias. In the preferred deposition process, first a nickel coat of about 1 μm thickness is plated on the copper foil, and then a gold coat about 2 to 3 μm thick is plated on the nickel coat.

In an optional step, a copper coat may first be deposited on the exposed copper metal foil in the preferred thickness range of 10 to 20 μm, before the nickel plating is performed. This copper coat adds some strength and rigidity to the lands and traces, and in the through-holes.

In the next process step, the semiconductor chip is assembled on the substrate by attaching the chip bumps to the bump pads. Preferably, this attaching step involves gold to gold interdiffusion. As a result of the chip attachment, the chip is positioned over the lands on the vias in the central substrate region, providing the opportunity to use these vias under the chip area as signal connections in non-common net assignments.

In the next process step, solder bodies are reflowed into the vias on the second substrate surface and completely fill the vias are with metal, leaving a sizeable amount of solder material outside the vias for connections to external parts.

After the step of assembling the chip, an optional process step may be performed to enhance the reliability of the BGA device. In this step, any space between the assembled chip and the insulator mask is filled with a polymer precursor compound; frequently, such compound is called an underfill material, because the precursor is pulled into the space between chip and insulator mask by capillary forces. After the underfill step, the precursor is allowed to polymerize at elevated temperatures.

Another optional process step, after the underfill step, is encapsulating the substrate surface, including the insulator mask and the assembled chip, with a protective polymer compound. The preferred method is a molding technique using an epoxy-based, filler-enhanced compound. This step is followed by polymerizing (hardening) the compound at elevated temperatures.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, in a flip-chip BGA-type package. The material of the semiconductor chip may comprise silicon, silicon germanium, gallium arsenide, or any other semiconductor or compound material used in integrated circuit manufacturing.

As an example, the invention applies to BGA substrates with different pitches of the two-dimensional site array in the central region and in the peripheral regions. Those substrates may include unselected array sites, which are offset between the peripheral and central regions.

As another example, the invention applies to BGA devices with substrates having one or more metal layers and thus more than one level of traces.

It is therefore intended that the appended claims encompass any such modifications or embodiment.

We claim:

1. A method for fabricating an electronic device comprising the steps of:
    opening n times m through-holes at the center of a substrate forming a n-row-by-m-column first array of through-holes at a first pitch, where n and m are integers no smaller than 3;
    opening through-holes adjacent to the first array extending towards edges of the substrate forming a second array of through-holes, including the first array of through-holes, at the first pitch;
    forming metal lands on a first substrate surface covering the through-holes;
    forming a metal trace on the first substrate surface extending from each metal land; and
    placing a plurality of the traces on the first substrate surface between at least two adjacent pairs of through-holes of the second array of through-holes where the two through-holes of each of the at least two adjacent through-hole pairs are spaced multiple first pitches apart from each other.

2. The method of claim 1, further comprising opening through-holes at the edges of the substrate forming a third two-dimensional array of through-holes including at least three rows of through-holes parallel to each edge.

3. The method of claim 2, further comprising forming an elongated gap free of through-holes therein and perpendicular to an edge of the substrate, wherein through-holes of the third array adjacent to the gap are spaced multiple second pitches apart from each other.

4. The method of claim 3, further comprising placing the plurality of the traces across the elongated gap.

5. The method of claim 4, further comprising terminating the plurality of the traces at an edge of the substrate.

6. The method of claim 1, in which the metal lands and the metal traces are formed on a first surface of the substrate.

7. The method of claim 2, further comprising forming metal lands covering the through-holes of the third array of through-holes.

8. The method of claim 2, further comprising forming metal traces extending from the metal land covering the through-holes of the third array of through-holes.

9. The method of claim 6, further comprising flip bonding a semiconductor chip on the first surface of the substrate.

10. The method of claim 7, in which the flip bonding comprising forming metallurgical bonds between the semiconductor chip and the metal traces.

11. The method of claim 7, in which the semiconductor chip covers the second array of through holes.

12. The method of claim 6, in which the substrate has a second surface opposite the first surface and free of metal lands and metal traces.

13. The method of claim 1, in which n is equal to m.

* * * * *